United States Patent [19]
Tokito et al.

[11] Patent Number: 5,780,174
[45] Date of Patent: Jul. 14, 1998

[54] MICRO-OPTICAL RESONATOR TYPE ORGANIC ELECTROLUMINESCENT DEVICE

[75] Inventors: Shizuo Tokito, Nagoya; Koji Noda, Aichi-ken; Yasunori Taga, Nagoya, all of Japan

[73] Assignee: Kabushiki Kaisha Toyota Chuo Kenkyusho, Aichi-ken, Japan

[21] Appl. No.: 736,726

[22] Filed: Oct. 25, 1996

[30] Foreign Application Priority Data

Oct. 27, 1995 [JP] Japan .................. 7-280162

[51] Int. Cl.⁶ ........................................ H05B 33/12
[52] U.S. Cl. .................. 428/690; 428/917; 313/506; 313/507; 313/509; 372/92; 372/98; 372/99; 372/102
[58] Field of Search ................. 428/690, 917; 313/500, 507, 509; 372/92, 98, 99, 102

[56] References Cited

U.S. PATENT DOCUMENTS 4,720,432  1/1988  Vanslyke et al. ............... 428/457
5,478,658  12/1995 Dodabalapur et al. .

FOREIGN PATENT DOCUMENTS 59-194393  11/1984  Japan .
3-163186   7/1991   Japan .
6-275381   9/1994   Japan .
6-283270   10/1994  Japan .
WO 94/07344 3/1994  WIPO .

OTHER PUBLICATIONS

Tetsuo Tsutsui, et al., "Sharply Directed Emission in Organic Electroluminescent Diodes with an Optical-Microcavity Structure", Appl. Phys. Lett. 65 (15), 10 Oct. 1994, pp. 19–21.

Chihaya Adachi, et al., "Organic Electroluminescent Device Having a Hole Conductor as an Emitting Layer", Appl. Phys. Lett. 55 (15), 9 Oct. 1989, pp. 1489–1491.

C. W. Tang, et al., "Organic Electroluminescent Diodes", Appl. Phys. Lett. 51 (12), 21 Sep. 1987, pp. 913–915.

*Primary Examiner*—Marion E. McCamish
*Assistant Examiner*—Cheryl Juska
*Attorney, Agent, or Firm*—Oblon, Spivak, McClelland, Maier & Neustadt, P.C.

[57] ABSTRACT

A micro-optical resonator type organic electroluminescent device utilizing an organic electroluminescent material high in emission efficiency but broad in emission spectrum width, has a narrow half bandwidth in the emission peak and a superior forward directivity and an excellent monochromaticity in light not separate into components, wherein a micro-optical resonator is formed by a multi-layered mirror and a metal mirror. The optical length of the micro-optical resonator, calculated from the total thickness and the refractive index of a transparent conductive layer and a luminous layer placed between the multi-layered mirror and the metal mirror and also from the light penetration depth into the multi-layered mirror, is 1.5 times the wavelength of a desired light emitted from the device, and the desired light is set on the short wavelength side of the emission spectrum of the electroluminescent material.

12 Claims, 9 Drawing Sheets

22: METAL MIRROR
20: ELECTRON TRANSPORT LAYER
16: LUMINOUS LAYER
18: HOLE TRANSPORT LAYER
14: TRANSPARENT CONDUCTIVE LAYER
12: MULTI-LAYERED MIRROR
10: TRANSPARENT SUBSTRATE

MICRO-OPTICAL RESONATOR TYPE ORGANIC ELECTROLUMINESCENT DEVICE

BACKGROUND OF THE INVENTION

1. Field of the Invention

The present invention relates to a monochrome electroluminescent element to be used in a display device, electroluminescent devices for telecommunications, etc. having an emission spectrum of a narrow half bandwidth and a sharp forward emission directivity created by utilizing a micro-optical resonator structure.

2. Description of the Related Art

With the growing diversification and space saving in information equipment in recent years, there has been increasing need for flat type display devices which consume less electric power and occupy a smaller space than CRTs. In the category of flat type display devices, there are liquid crystal and plasma display devices. Expectations are high for organic electroluminescent elements of self-emission type which produce vivid display images and can be driven by d.c. voltage.

For the performance obtained so far of the organic electroluminescent device, a brightness of 1000 cd/m$^2$ or above at a driving voltage of 10 V or less has been obtained, and they can emit all of the three primaries of blue, green, and red. However, since the emission spectrum of the electroluminescent material is wide, the color purity is poor, and light is emitted from the device in a wide angle, so that directivity is unsatisfactory.

There has recently been a report that when a micro-optical resonator was formed in a device using metal mirrors or multi-layered mirrors, the device emitted light enhanced according to the gap of the micro-optical resonator. More specifically, research is in progress for obtaining a monochromatic color or a higher directivity of the emitted light (Appl. Phys. Lett., 63.594—1993; Appl. Phys. Lett., 63.2032—1993).

Figure 16:
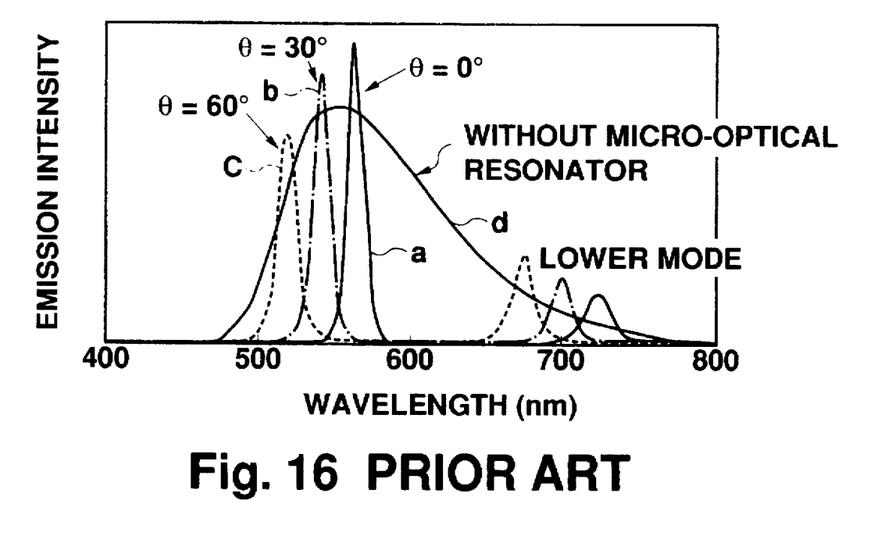
FIG. 16 is a diagram showing a general emission spectrum with angle dependence for a conventional micro-optical resonator type organic electroluminescent device including a micro-optical resonator.

FIG. 16 shows the emission spectra a, b, and c when the above-mentioned micro-optical resonator was mounted and the viewing angle with respect to the device was varied to 0°, 30°, and 60°, as well as the emission spectrum d when no micro-optical resonator was mounted. The viewing angle is the angle of the line of sight of the viewer with respect to the normal of the light-emitting surface of the device.

As seen in FIG. 16, as compared with the emission spectrum d when no micro-optical resonator was provided, emission with a spectrum of a smaller half bandwidth was obtained for the emission spectra a, b and c where the micro-optical resonator was provided.

However, the peaks of emission spectra a, b, and c where the micro-optical resonator was provided varied with the viewing angle. In other words, as the viewing angle increases, the luminescent color changes toward the shorter wavelength side, so that light of various wavelengths can be seen.

Figure 17:
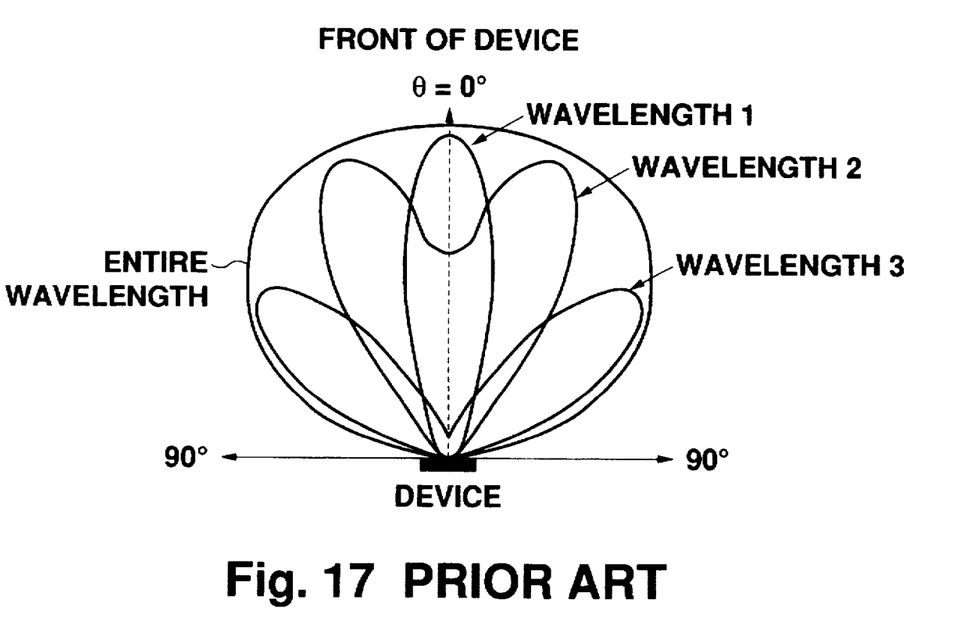
FIG. 17 is a diagram showing a general radiation pattern in a conventional organic electroluminescent device including a micro-optical resonator.

FIG. 17 shows the distribution of intensities of the light that can be seen from the directions of the viewing angles when a micro-optical resonator was provided. In FIG. 17, the wavelengths 1, 2, and 3 represent the light intensities corresponding to the emission spectra a, b, and c in FIG. 16. The intensity distribution of the whole light, that is, the light which is not separated into its components, is represented by the whole wavelength. As seen from FIG. 17, in the separated components of the light, directivity can be recognized for each wavelength, but directivity is barely recognizable for light which is not separated, in other words, the light intensity distribution spreads for a wide viewing angle.

In FIG. 16, besides the emission peaks a, b, and c, another emission peak (lower mode) is observed on the long wavelength side, which constitutes a multimode. Thus, the color purity is degraded.

This multimode occurs due to the large thickness of the organic compound and transparent conductive layer in the micro-optical resonator. There have been reported examples in which the total thickness of the transparent conductive layer, such as an indium tin oxide(ITO), and the organic compound layer is 300 nm or more. However, to obtain a single mode by excluding a lower mode from a multimode, it is generally required to reduce the thickness of the organic compound and the transparent conductive layer.

With regard to the angle dependence of the emission spectrum, there is a report that in a device using a compound having an emission spectrum with a sharp peak, a strong light beam with an emission spectrum of a small angle dependence and a narrow half bandwidth is emitted forward from the device (Appl. Phys. Lett., 65.15—1994). However, since the fluorescence quantum efficiency of the material is not high, the light intensity is low, and high emission efficiency has not been obtained.

SUMMARY OF THE INVENTION

The present invention has been made to solve the above problems, and has as its object to provide a micro-optical resonator type organic electroluminescent device which can utilize an organic luminescent material high in emission efficiency but broad in emission spectrum width, which has a narrow half bandwidth in the emission peak, and which is superior in forward directivity and monochromaticity, even with an unseparated light beam.

To achieve the above object, according to a first aspect of the invention, a micro-optical resonator type organic electroluminescent device comprises a multi-layered mirror having two layer types with different refractive indexes alternately laminated, a transparent conductive layer as an anode formed on the multi-layered mirror, an organic compound layer of a single layer or a plurality of layers formed on the transparent conductive layer, and a metal mirror as a cathode capable of reflecting light, the multi-layered mirror and the metal mirror forming a micro-optical resonator for enhancing light output from the organic compound layer, wherein an optical length of the micro-optical resonator is set such that a radiation from the micro-optical resonator has a single mode spectrum free of low mode components, and the radiation has a strong forward directivity from the device.

According to the above arrangement, output light from the organic compound layer of a specific wavelength is strengthened through resonance by a micro-optical resonator comprising a multi-layered mirror and a metal mirror. Therefore, a light beam of a desired wavelength can be obtained from the light emitted from the organic compound layer.

According to a second aspect of the invention, in the micro-optical resonator type organic electroluminescent device according to the first aspect of the invention, the optical length L of the micro-optical resonator is given by an equation shown below which takes into account the penetration depth of light into the inside of the multi-layered mirror, $$L = \frac{\lambda}{2} \left( \frac{n_{\mathit{eff}}}{\Delta n} \right) + \Sigma n_i d_i \cos\theta$$

where $\lambda$ is the wavelength of a resonating light, neff is the effective refractive index of the multi-layered mirror, $\Delta n$ is the difference of the refractive indexes of the two kinds of layers in the multi-layered mirror, ni and di are the refractive index and the thickness of the organic compound and the transparent conductive layer, and $\theta$ is the angle of the light incident on an interface between organic compound layers or between an organic compound layer and a transparent conductive layer, with respect to the normal stood on the interface, wherein the optical length L is 1.5 times a required emission wavelength.

In the above arrangement, $\lambda/2$ (neff/$\Delta n$) in the first term of the equation represents the penetration depth of resonating light into the multi-layered mirror. As is clear from the first term, the neff and the $\Delta n$ are constants determined by the materials constituting the multi-layered mirror, so that if the wavelength $\lambda$ of light is determined, the penetration depth can then be determined. The refractive index ni of each layer in the second term is also a constant determined by the material, and the thickness of each layer of the multi-layered mirror is set at $\lambda/4$. Therefore, the optical length L can be controlled by varying the total thickness di of the transparent conductive layer and the organic compound layer.

The wavelength of light resonating with the micro-optical resonator is determined by the above-mentioned optical length L. Specifically, light for which the optical length L corresponds to integer multiples of ½ of the wavelength, can resonate with the micro-optical resonator. Therefore, as the total thickness of the transparent conductive layer and the organic compound layer is reduced to decrease the optical length L, the wavelength of light emitted from the device resonating with the micro-optical resonator shifts towards shorter wavelengths. In this case, light for which the optical length L is equal to 1.5 times ½ of the wavelength, has the longest wavelength as resonating light. Accordingly, light emitted from the device has a shorter wavelength than the above-mentioned wavelength. As the light emitted from the device has a short wavelength, it is possible to obtain light with a higher forward directivity. By decreasing the optical length L, the emission mode can be made a single mode.

According to a third aspect of the invention, in the micro-optical resonator type organic electroluminescent device according to the second aspect of the invention, the total thickness of the transparent conductive layer and the organic compound layer is 150 nm or less.

According to a fourth aspect of the invention, in the micro-optical resonator type organic electroluminescent device according to the first aspect of the invention, the uppermost layer of the multi-layered mirror is formed of a transparent conductive layer and functions as a part of the multi-layered mirror, while also serving as the transparent conductive layer.

In the above arrangement, since the uppermost layer works as a part of the multi-layered mirror and serves also as the transparent conductive layer, there is provided a margin for the thickness of the device, so that the thickness of the transparent conductive layer can be increased.

According to a fifth aspect of the invention, in the micro-optical resonator type organic electroluminescent device according to the first aspect of the invention, a required emission wavelength is set on a shorter wavelength side than a peak wavelength $\lambda m$ of an emission spectrum of an electroluminescent material to be used.

According to a sixth aspect of the invention, in the micro-optical resonator type organic electroluminescent device according to the fifth aspect of the invention, the required emission wavelength is in a range from ($\lambda m-10$) nm to ($\lambda m-50$) nm.

According to a seventh aspect of the invention, in the micro-optical resonator type organic electroluminescent device according to the first aspect of the invention, the organic compound layer is any of a single-layer structure of a luminous layer, a two-layer structure of a hole transport layer and a luminous layer or a luminous layer and an electron transport layer, or a three-layer structure of a hole transport layer, a luminous layer and an electron transport layer. In this case, the luminous layer whose emission efficiency has been improved by doping is used.

According to an eighth aspect of the invention, in the micro-optical resonator type organic electroluminescent device according to the first aspect of the invention, the optical length of each layer of the multi-layered mirror is designed to be ¼ of the center wavelength of a stop band.

According to a ninth aspect of the invention, in the micro-optical resonator type organic electroluminescent device according to the first aspect of the invention, the multi-layered mirror is formed by alternately laminating two types of layers with different refractive indexes, the layers being formed of oxides, nitrides, or semiconductors, or a combination of these materials. Note that in the multi-layered mirror having a transparent conductive layer as the uppermost layer, the uppermost layer is formed of a transparent conductive compound.

According to a tenth aspect of the invention, in the micro-optical resonator type organic electroluminescent device according to the ninth aspect of the invention, the multi-layered mirror is formed by any of the combinations of $TiO_2$ and $SiO_2$, SiNx and $SiO_2$, $Ta_2O_5$ and $SiO_2$, and GaAs and GaInAs.

According to an eleventh aspect of the invention, in the micro-optical resonator type organic electroluminescent device according to the first aspect of the invention, the transparent conductive layer is made of a material of a large work function.

According to a twelfth aspect of the invention, in the micro-optical resonator type organic electroluminescent device according to the eleventh aspect of the invention, the transparent conductive layer is formed of Pt, Au, Ni, Cu, Ag, Ru, Cr, ITO, $SnO_2$, $In_2O_3$ or ZnO or a composite of those materials.

According to a thirteenth aspect of the invention, in the micro-optical resonator type organic electroluminescent device according to the first aspect of the invention, the metal mirror is formed of a material with a small work function.

According to a fourteenth aspect of the invention, in the micro-optical resonator type organic electroluminescent device according to the thirteenth aspect of the invention, the metal mirror is formed of Al, Mg, Ca, Li, Na, Ag, or Y, or an alloy of those metals.

According to each of the above arrangements, by controlling the optical length of the micro-optical resonator and optimizing the required emission wavelength, a micro-optical resonator type organic electroluminescent device high both in monochromaticity and forward directivity can be obtained.

DESCRIPTION OF THE PREFERRED EMBODIMENTS OF THE INVENTION

Preferred embodiments of the present invention will be described with reference to the accompanying drawings.

FIGS. 1 to 4 show sectional views of examples of the micro-optical resonator type organic electroluminescent devices according to the present invention. In those embodiments, a multi-layered mirror 12 is formed on a transparent substrate 10. The multi-layered mirror 12 is formed by alternately laminating two layer types with different refractive indexes, formed of oxide, nitride, or a semiconductor or a combination of these. Representative examples of combinations are dielectric materials such as $TiO_2$ and $SiO_2$, $SiNx$ and $SiO_2$, $Ta_2O_5$ and $SiO_2$, and semiconductor multi-layered films such as GaAs and GaInAs.

The multi-layered mirror 12 reflects light at the interfaces of the layers. The thickness of the multi-layered mirror 12 is set at λ/4 with respect to the wavelength λ (required emission wavelength) of the light to be used so that a stronger light is produced by light beams reflected by the respective interfaces.

Formed on the multi-layered mirror 12 is a transparent conductive layer 14 as the anode. For the transparent conductive layer 14, a material of a large work function is used so that holes as carriers can be easily introduced into the organic compound layer. The materials that can be used for the transparent conductive layer 14 are a metal such as Pt, Au, Ni, Cu, Ag, Ru, or Cr or a transparent conductive oxide such as ITO (Indium Tin Oxide), $SnO_2$, $In_2O_3$ or ZnO or a composite material of those materials.

At least one layer of an organic compound is formed on the transparent conductive layer 14. There are three types of layers for the organic compound layer: a luminous layer 16 to emit light by recombination of holes and electrons introduced from the anode and the cathode, a hole transport layer 18 to transport holes to the luminous layer 16, and an electron transport layer 20 to transport electrons to the luminous layer 16. Those layers are used as necessity demands. Specifically, the organic compound layer may be a single layer structure using only a luminous layer 16, or a two-layer structure using a luminous layer 16 and a hole transport layer 18 or a luminous layer 16 and an electron transport layer 20, or a three-layer structure using a luminous layer 16, a hole transport layer 18 and an electron transport layer 20.

The wavelength of light emitted from the luminous layer 16 optionally can be selected by changing the luminous material used for the luminous layer.

The materials that can be used for the luminous layer 16 include a metal chelate oxinoid compound such as 8-hydroxyquinoline metal complex (Japanese Laid-Open Patent Publication No. Sho 59-194393), a butadiene derivative, a perinone derivative, or a bisstyrylbenzene derivative (Japanese laid-Open Patent Publication No. Hei 3-1163186). A derivative of poly (paraphenylenevinylene) is a typical example of a polymeric compound material. The emission spectrum should preferably have a shape with a sharp rise on the short wavelength side.

A compound including aromatic third-grade amine is a representative material of the hole transport layer 18. An example of this is a compound of allylamine or triallylamine (U.S. Pat. No. 4,175,960, U.S. Pat. No. 453,950). What is most desirable is a third-grade amine compound, an example of which is a polymer of triallylamine.

8-hydroxyquinoline metal complex (Japanese Laid-Open Patent Publication No. Sho 59-194393) and an oxyazole derivative (Appl. Phys. Lett. 55,1489—1989) are representative materials of the electron transport layer 20.

As materials for the luminous layer 16, the hole transport layer 18 and the electron transport layer 20, any well-known materials used for organic electroluminescent devices can be used. The organic compound layer need not necessarily be formed of one of the above-mentioned homogeneous materials, but may be one featuring high efficiency obtained by doping, a derivative of poly (p-phenylenevinylene) or a mixed layer obtained by dispersing the material in a general-purpose polymeric compound. The types of organic compounds and the lamination structure are not limited.

A metal mirror 22 is formed on the organic compound layer mentioned above. In addition to its function as a cathode, the metal mirror also performs a function to reflect light emitted from the luminous layer 16.

The metal mirror 22 of a small work function is used to allow the electrons as carriers to be easily introduced into the organic compound layer. The metal mirror should preferably have a high light reflectance, specifically, the reflectance should be 90% or greater.

Actual examples of materials used for the metal mirror 22 include Al, Mg, Ca, Li, Na, Ag, or Y, or alloys of those metals.

A micro-optical resonator type organic electroluminescent device obtained as described may include a separate protective layer or may be entirely contained in a cell to improve stability and particularly to protect against moisture or oxygen in the atmospheric air. It is possible to cover the device with a heat conductive protective layer to release heat from the device or cover the metal mirror with a metal of the same or a different metal. This will improve the stability of the device.

In the above-mentioned micro-optical resonator type organic electroluminescent device according to the present invention, a micro-optical resonator is formed by combining the multi-layered mirror 12 and the metal mirror 22. A light beam of a specific wavelength out of the light emitted from the luminous layer 16 is strengthened by resonance by the micro-optical resonator. Therefore, a light with a desired wavelength can be selected from the light from the luminous layer 16 and, as a result, even when an organic electroluminescent material having a high emission efficiency and an emission spectrum with a broad width is used as a luminous layer, radiation with a narrow and sharp half bandwidth can be obtained.

Figure 5:
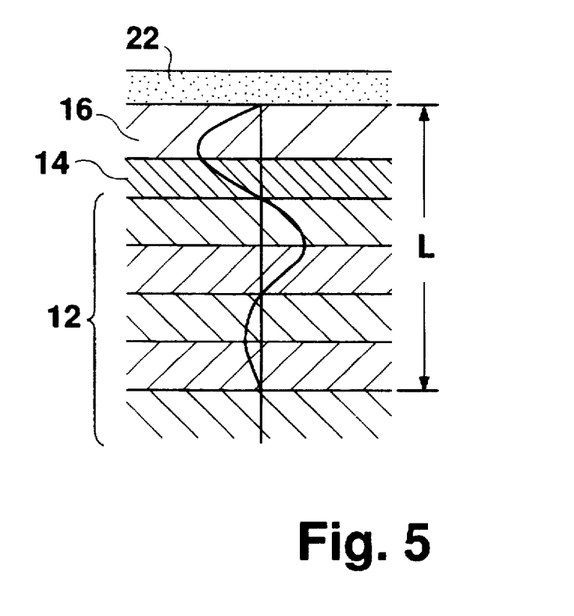
FIG. 5 is a sectional view of a micro-optical resonator in the micro-optical resonator type organic electroluminescent device according to the present invention.

FIG. 5 shows a sectional view of the micro-optical resonator in the micro-optical resonator type organic electroluminescent device according to the present invention. Though the organic compound layer in a single layer structure comprising only the luminous layer 16 is shown in FIG. 5, the principle is the same for a two-layer or three-layer organic compound layer.

As seen in FIG. 5, the micro-optical resonator comprises the multi-layered mirror 12 and the metal mirror 22, and the transparent conductive layer 14 and the luminous layer 16 (organic compound layer) exist between the two mirrors. Therefore, in the micro-optical resonator, the optical length is a sum of products of thicknesses of the luminous layer 16 and the transparent conductive layer 14 multiplied by the respective refractive indexes and the penetration depth of light into the multi-layered mirror 12 when resonance is occurring.

The optical length L of the micro-optical resonator is obtained by the following equation.

$$L = \frac{\lambda}{2} \left( \frac{n_{\text{eff}}}{\Delta n} \right) + \Sigma n_i d_i \cos\theta \quad (1)$$

where $\lambda$ is the wavelength of a resonating light, neff is the effective refractive index of the multi-layered mirror, $\Delta n$ is the difference of the refractive indexes of the two kinds of layers in the multi-layered mirror, ni and di are the refractive index and the total thickness of the organic compound layer and the transparent conductive layer in the micro-optical resonator, and $\theta$ is the angle between the light incident on an interface between organic compound layers or between an organic compound layer and a transparent conductive layer and the normal stood on the interface.

In the above equation, the first term $\lambda/2$ (neff/$\Delta n$) represents the penetration depth of the resonating light into the multi-layered mirror 12. As will be apparent from the first term, neff and the $\Delta n$ are constants determined by the materials forming the multi-layered mirror 12, so it follows that when the wavelength $\lambda$ of the light is determined, the penetration depth is also determined. The refractive index ni of each layer in the second term is also a constant determined by the material, and the thickness of each layer of the multi-layered mirror 12 is set at $\lambda/4$ as described above. Therefore, the optical length L can be controlled by changing the value of total thickness di of the transparent conductive layer 14 and the luminous layer 16.

The wavelength of the light resonating with the micro-optical resonator is determined by the above-mentioned optical length L. In other words, light for which the optical length L corresponds to integer multiples of ½ of the wavelength can resonate with the micro-optical resonator. FIG. 5 shows light for which the optical length L is equal to three times ½ of the wavelength, that is, 1.5 times the wavelength, which is the longest wavelength of resonating light.

As has been described, as the total thickness of the transparent conductive layer 14 and the organic compound layer is decreased to reduce the optical length L, the wavelength of light which resonates with the micro-optical resonator and is emitted from the device shifts to a shorter wavelength. As the wavelength of light emitted from the device becomes shorter, light high in forward directivity can be obtained. When the optical length L is reduced, the emission mode of the device can be made a single mode.

Figure 6:
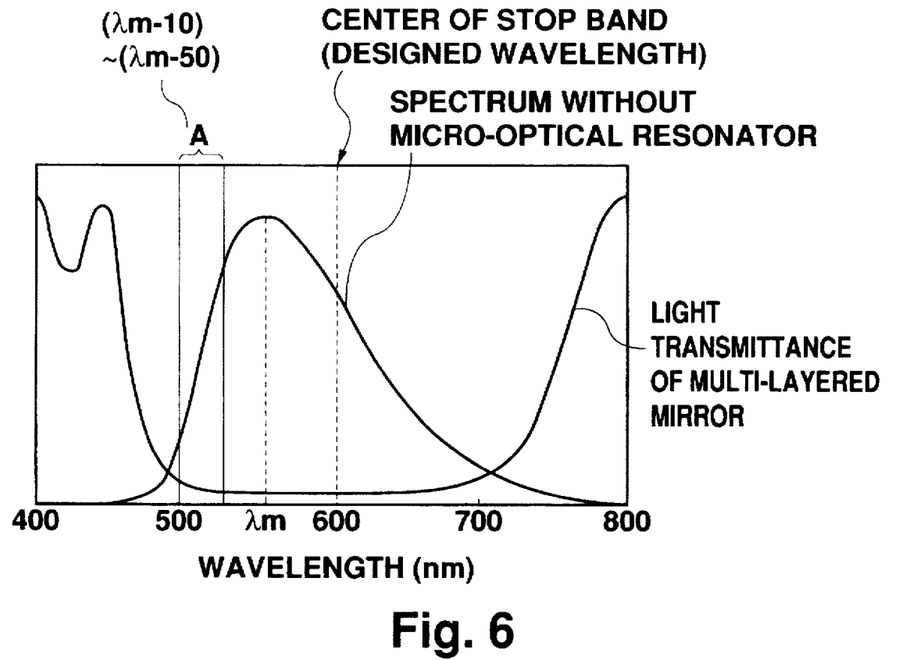
FIG. 6 is a diagram showing the relation among the emission spectrum, the transmittance of the multi-layered mirror, and the emission mode position when no micro-optical resonator is provided.

More specifically, by controlling the optical length L of the micro-optical resonator, the wavelength of light emitted from the device is shifted to a shorter wavelength than the peak wavelength $\lambda_m$ of the emission spectrum of the electroluminescent material itself (without a micro-optical resonator), and into the wavelength range A (nm), which is the rising portion of the emission spectrum, as shown in FIG. 6. The wavelength range A (nm) should desirably be from ($\lambda_m$−10) to ($\lambda_m$−50), as an example.

If the range A is of a shorter wavelength than ($\lambda_m$−50), the emission intensity of light emitted from the luminous layer 16 is low, and the device is unable to function as an electroluminescent device. If the range A is of a longer wavelength than ($\lambda_m$−10), light corresponding to the wavelength is present with high intensity in the emission spectrum when the viewing angle is changed and light emitted from the device changes to a shorter wavelength in cases without a micro-optical resonator. Therefore, if viewed from that viewing angle, this light comes into view, and dependence of the light emitted from the device on the viewing angle is great. Accordingly, for the light emitted from the device, unless this light is separated into components, strong forward directivity from the device cannot be obtained.

In contrast, in the above-mentioned range A, even when the viewing angle is changed and the light emitted from the device changes to a shorter wavelength, light corresponding to the changed wavelength is either not present in the emission spectrum or, if such a light is present, the intensity is low, so that the dependence on the viewing angle can be eliminated and thus light with a strong forward directivity can be obtained.

When the optical length L in FIG. 5 is set at a large value, the desired light to be emitted from the device is not light resonating at three times ½ the wavelength, but four or more times as long as ½ of the wavelength, which corresponds to the optical length L. In this case, since light resonating at three times as long as ½ of the wavelength also exists and remains in a high intensity region in the above-mentioned emission spectrum, constituting a low mode (as shown in FIG. 16), the light emitted from the device has a multimode.

Figure 12:
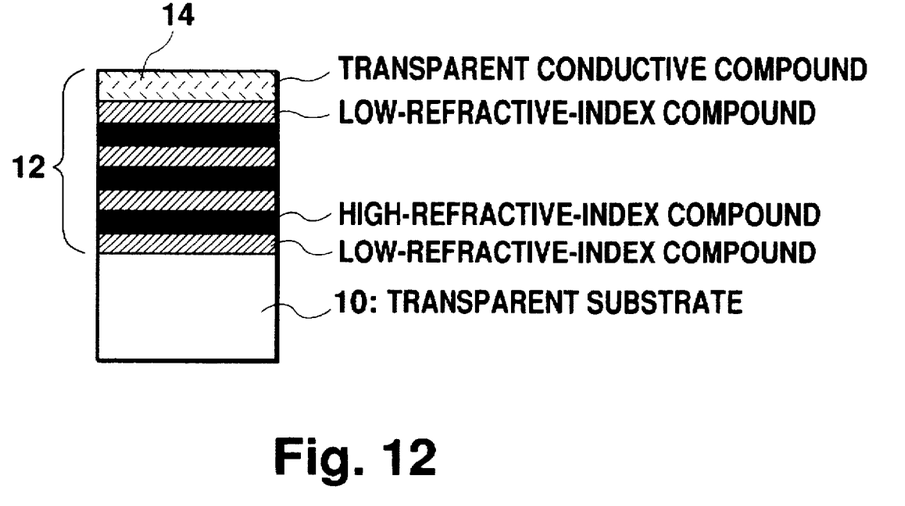
FIG. 12 is a sectional view of another example of the micro-optical resonator in the micro-optical resonator type organic electroluminescent device according to the present invention.
Figure 13:
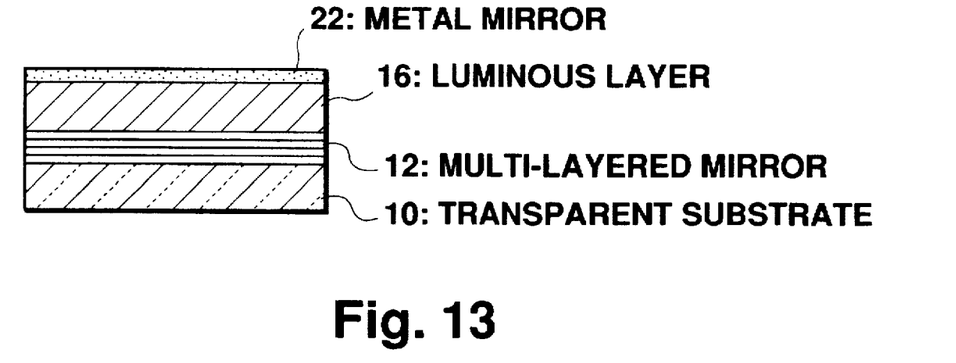
FIG. 13 is a sectional view of still another example of the micro-optical resonator type organic electroluminescent device according to the present invention.

From the foregoing, in order to obtain light of a single mode, it is necessary to set the optical length L at 1.5 times (three times as long as ½ of the wavelength) the required emission wavelength. A method to this end is to set a small value for the total thickness di of the transparent conductive layer 14 and the organic compound layer in the second term of the above equation (1). In this case, to set the optical length L at 1.5 times the emission wavelength, it is necessary to use a total thickness of the transparent conductive layer 14 and the organic compound layer of 150 nm or less. Another method is to use a multi-layered mirror in which the uppermost layer has been replaced with a transparent conductive layer 14. In this method, as shown in FIG. 12, a low-refractive-index compound and a high-refractive-index compound are alternately stacked on the transparent substrate 10, and a transparent conductive compound is deposited on the final deposited low-refractive-index compound. In FIG. 12, the uppermost layer of the multi-layered mirror 12 works as a part of the multi-layered mirror and also serves as the transparent conductive layer 14. FIG. 13 shows an example of a micro-optical resonator type organic electroluminescent device using this multi-layered mirror 12. In FIG. 13, since the uppermost layer of the multi-layered mirror serves as the transparent conductive layer 14, it is not necessary to provide an independent transparent conductive layer 14. Therefore, there is provided a margin for the thickness of the micro-optical resonator, so that the thickness of the transparent conductive layer 14 can be increased by the amount of the margin, by which the electrical resistance of the transparent conductive layer 14 can be decreased.

FIG. 6 shows the light transmittance of the multi-layered mirror 12. In the light transmittance in FIG. 6, the high reflection region, that is, the stop bandwidth, is set so as to cover the emission spectrum when no micro-optical resonator is provided. The reflectance in this region is preferably in a range of 50% to 99.9% (transmittance of 50% to 0.1%), but may be optionally selected according to the purpose of use of the device. Generally, the half bandwidth of the emission spectrum is narrower with a sharper peak for higher reflectance. Description will now be made of embodiments of the micro-optical resonator type organic electroluminescent device according to the present invention and comparative examples.

Embodiment 1

Assuming wavelength of light emitted from the device to be 500 nm, a micro-optical resonator type organic electroluminescent device was produced under the following conditions.

On a transparent glass substrate, a multi-layered mirror was formed by laminating four $SiO_2$ layers and four $TiO_2$ layers alternately by RF magnetron sputtering in such an order that the final layer is $TiO_2$. The central wavelength of the stop band was designed to be 550 nm. The transmittance of this stop band of the multi-layered mirror was 10%. A transparent conductive layer (ITO) was deposited to a thickness of 60 nm by RF magnetron sputtering on the multi-layered mirror. The resulting multi-layered substrate was washed sufficiently in an organic solvent, and then fixed in a vacuum evaporation system. A triphenyldiamine derivative 20 nm thick to serve as the hole transport layer and an alumiquinolinol complex 30 nm thick to serve as the luminous layer were deposited. The total resulting thickness of the transparent conductive layer and the organic compound layer was 110 nm.

The structural formulas of the triphenyldiamine derivative and the alumiquinolinol complex are shown below.

TRIPHENYLDIAMINE DERIVATIVE

ALUMINQUINOLINOL COMPLEX

From the total thickness of the transparent conductive layer and the organic compound layer, refractive index of each layer, and the penetration amount of light into the multi-layered mirror, the optical length of the micro-optical resonator in this device was 1.5 times the target wavelength of 500 nm, that is, 750 nm according to the above equation (1). Finally, a 180-nm-thick MgAg alloy (10:1) was vapor-deposited as the cathode.

Figure 1:
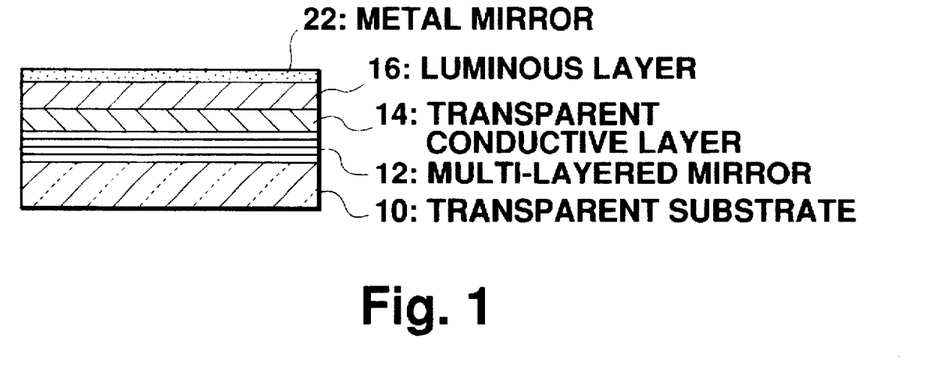
FIG. 1 is a sectional view of an example of the micro-optical resonator type organic electroluminescent device according to the present invention.
Figure 2:
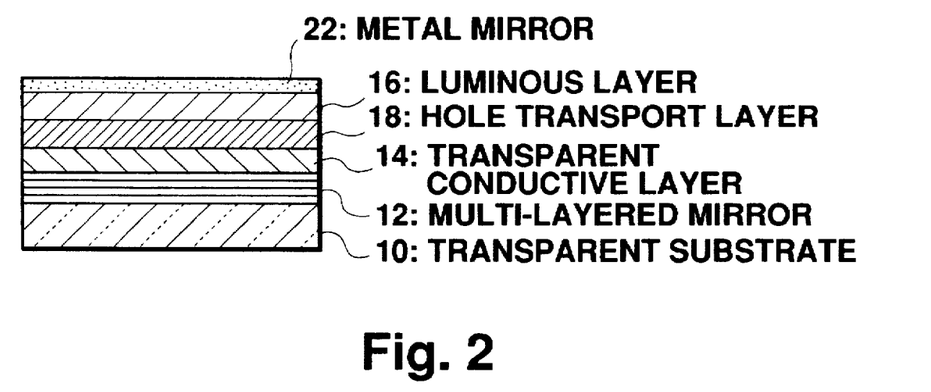
FIG. 2 is a sectional view of another example of the micro-optical resonator type organic electroluminescent device according to the present invention.
Figure 3:
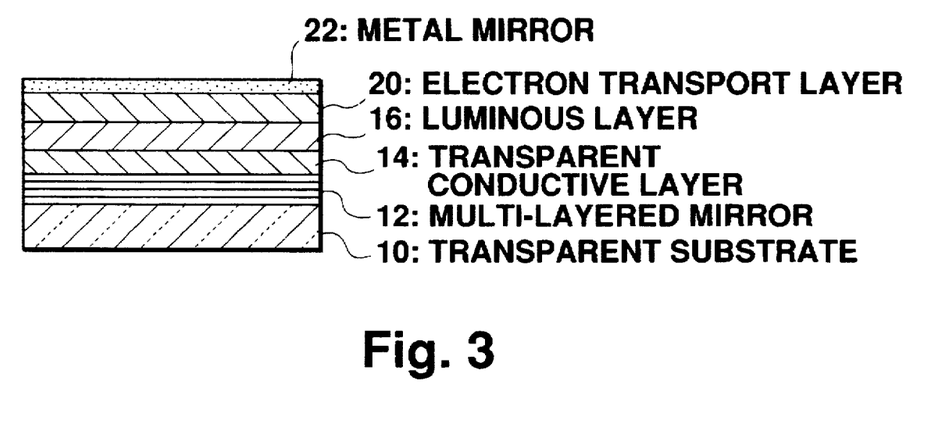
FIG. 3 is a sectional view of still another example of the micro-optical resonator type organic electroluminescent device according to the present invention.
Figure 4:
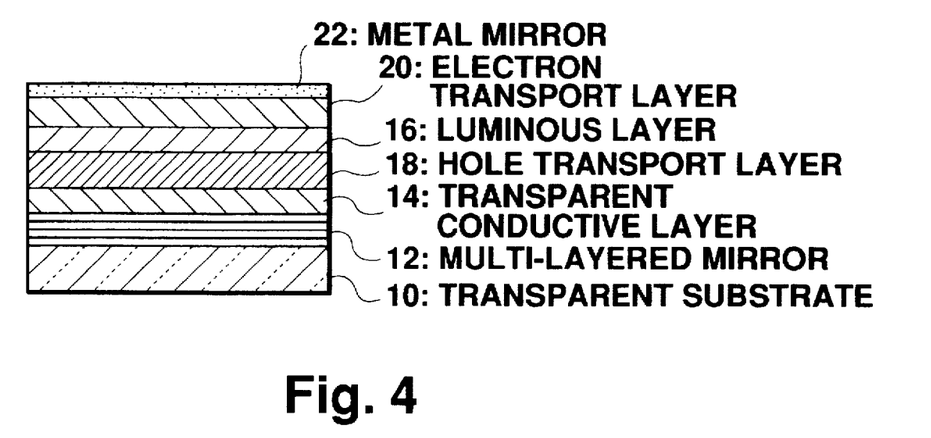
FIG. 4 is a sectional view of still another example of the micro-optical resonator type organic electroluminescent device according to the present invention.
Figure 7:
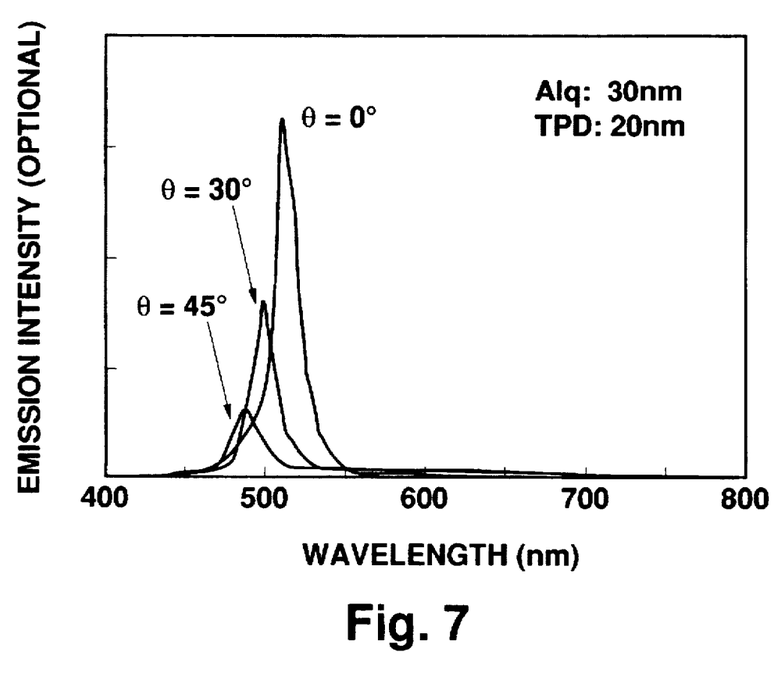
FIG. 7 is a diagram showing the emission spectrum and its angle dependence in a first embodiment of the present invention.

Thus, a micro-optical resonator type organic electroluminescent device corresponding to the one in FIG. 2 was produced. When a voltage of 8V was applied to the device, the device emitted a vivid bluish green light. The emission spectrum is shown in FIG. 7, in which there is only one peak at a wavelength of 510 nm and no other peak was observed, so that this is apparently light emission of a single mode. When the viewing angle was varied, the emission peak moved very little, and the intensity decreased sharply. This means that the dependence on the viewing angle has been removed.

Figure 8:
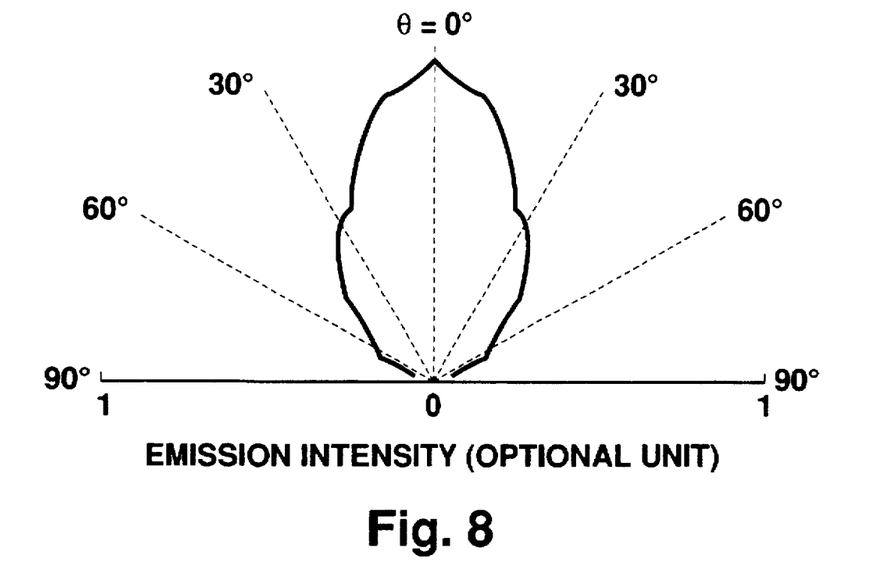
FIG. 8 is a diagram showing the radiation pattern in the first embodiment.

FIG. 8 shows the radiation pattern of the whole of the emitted light measured without separating the light into components. Even though the light is not separated into components, a strong forward directivity from the device was obtained (angle=0°). It was also found that a more intense light was emitted from this device than from another device without a micro-optical resonator installed ahead of it.

Comparative Example 1

By RF magnetron sputtering, a multi-layered mirror was formed by laminating four $TiO_2$ layers and four $SiO_2$ layers alternately in such an order that the final layer deposited was a $SiO_2$ layer. The reason for final depositing of $SiO_2$ was that there has already been proposed a device of such a structure.

On this multi-layered mirror, ITO in a thickness of about 200 nm was formed by RF magnetron sputtering. On this substrate, a triphenyldiamine derivative 50 nm thick and an alumiquinolinol complex 60 nm thick were vapor-deposited. Thus, the total thickness of the transparent conductive layer and the organic compound layer amounted to 310 nm.

In this comparative example, since $SiO_2$ with a low refractive index is at the top of the multi-layered mirror, there is not much reflection at the interface with ITO, so that when the equation (1) is used, it is necessary to add the thickness of this $SiO_2$ layer, to the thickness of the transparent conductive layer, the hole transport layer and the luminous layer. Therefore, by the total thickness and the refractive index of the uppermost $SiO_2$ layer, the transparent conductive layer, the hole transport layer and the luminous layer and the penetration amount of light into the multi-layered mirror, the optical length of the micro-optical resonator is about 2.5 times the target wavelength of 500 nm. Finally, a 180 nm MgAg alloy (10:1) was vapor-deposited to serve as the cathode.

Figure 9:
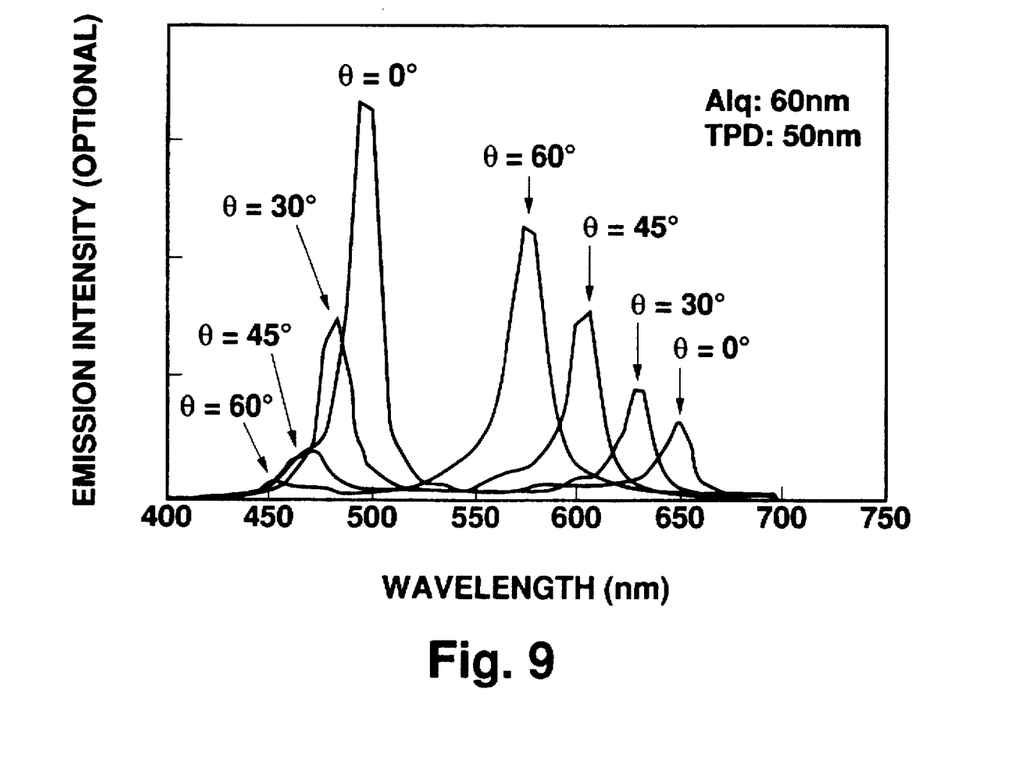
FIG. 9 is a diagram showing the emission spectrum and its angle dependence in a first comparative example.

FIG. 9 shows the emission spectrum in this comparative example. The emission with a sharp peak at a wavelength of 500 nm can be confirmed. In addition, another emission peak can be observed on the long wavelength side, in other words, this is a multimode. In the emission spectrum on this long wavelength side, when the viewing angle θ was varied, the emission peak moved notably to the short wavelength side.

Comparative Example 2

As in the embodiment 1, on the multi-layered mirror formed on the substrate, ITO 60 nm thick was deposited. On top of the ITO, a triphenyldiamine derivative 40 nm and a alumiquinolinol complex 50 nm were deposited in that order. The optical length amounted to about 1.5 times the target wavelength of 570 nm. Finally, a MgAg electrode was vapor-deposited in a thickness of 180 nm.

Figure 10:
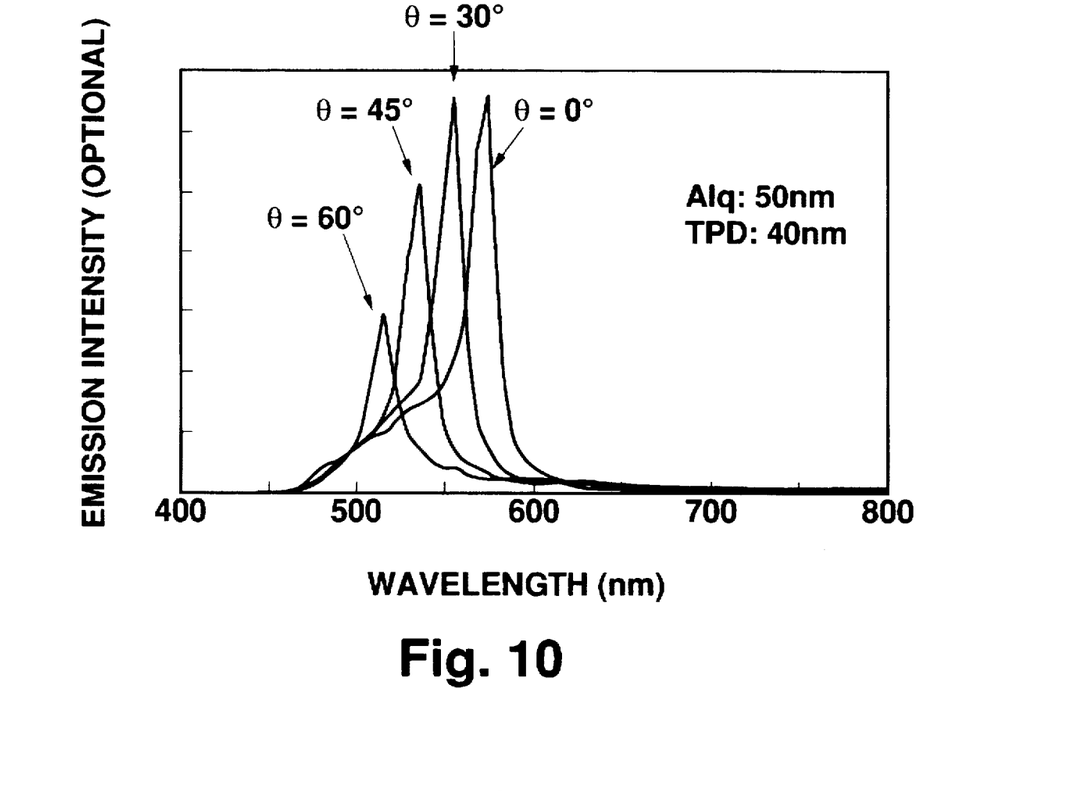
FIG. 10 is a diagram showing the emission spectrum and its angle dependence in a second comparative example.
Figure 11:
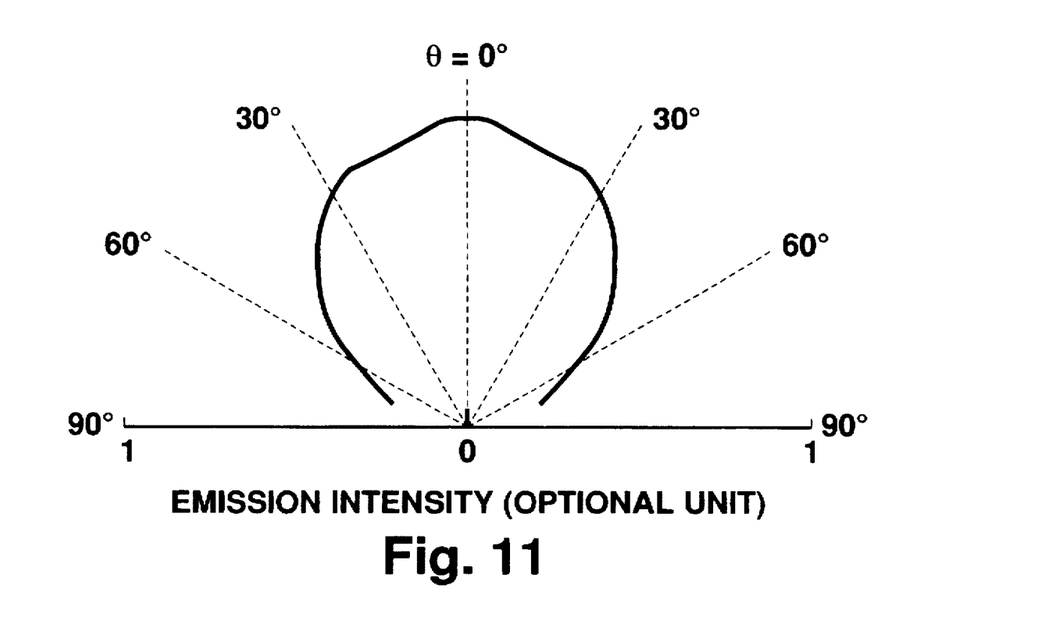
FIG. 11 is a diagram showing the radiation pattern in the second comparative example.

FIG. 10 shows the emission spectrum of the device in this comparative example. There is a sharp emission peak only at a wavelength of 570 nm and no other emission peak is recognized, so therefore this is emission of a single mode. However, in this comparative example, the required wavelength of 570 nm is longer than the range A in FIG. 6, and therefore as the viewing angle θ is varied, the emission peak moved widely to the shorter wavelength side. In a specific component light beam, a strong directivity is recognized, but in the total radiation pattern, directivity can hardly be recognized as shown in FIG. 11.

Embodiment 2

By using a different material for the luminous layer, a micro-optical resonator type organic electroluminescent device was produced which emits a luminescent color different from that in embodiment 1.

Using RF magnetron sputtering, a multi-layered mirror was formed by alternately laminating four $SiO_2$ layers and four $TiO_2$ in such an order that the final layer deposited is $TiO_2$. The central wavelength of the stop band of the multi-layered mirror was designed to be 620 nm. The transmittance of the stop band of the multi-layered mirror was 10%. 60 nm ITO was formed on the multi-layered mirror by RF magnetron sputtering. After it was washed sufficiently in an organic solvent, the multi-layered substrate was fixed in a vacuum evaporation system. A triphenyldiamine derivative 50 nm thick to serve as the hole transport layer and a phthaloperinone derivative 50 nm thick to serve as the luminous layer were vapor-deposited. Finally, 180-nm-thick MgAg alloy as the metal electrode was vapor-deposited.

The structural formula of phthaloperinone is shown below.

PHTHALOPERINONE

When a voltage of 10V was applied to the device in this embodiment, the device emitted a vivid yellow-green light. In the emission spectrum, there is a peak only at a wavelength of 540 nm and no other peak was observed. In the radiation pattern, a strong forward directivity from the device was achieved.

Embodiment 3

A micro-optical resonator type organic electroluminescent device was produced which emits an electroluminescent color different from that in embodiment 2.

On a transparent glass substrate, a multi-layered mirror was formed by alternately laminating four $SiO_2$ layers and four $TiO_2$ layers by RF magnetron sputtering in such an order that the final layer was $TiO_2$ deposited. The central wavelength of the stop band of the multi-layered mirror was 700 nm. The transmittance of the stop band of the multi-layered mirror was 10%. ITO was formed in a thickness of 60 nm on the multi-layered mirror by RF magnetron sputtering.

Next, a triphenyldiamine derivative 60 nm thick to serve as the hole transport layer and a perylene derivative 60 nm to serve as the luminous layer were vapor-deposited. Finally, a MgAg alloy as the metal electrode was vapor-deposited in a thickness of 180 nm.

The structural formula of the perylene derivative is shown in the following.

PERYLENE DERIVATIVE

When a voltage of 10V was applied to the device in this embodiment, the device emitted a vivid orange light. In the emission spectrum, there was a peak only at a wavelength of 600 nm and no other peak was observed. In the radiation pattern, a strong forward directivity from the device was achieved.

Embodiment 4

A fourth embodiment of this invention produced a micro-optical resonator type organic electroluminescent device with a multi-layered mirror in which the uppermost layer has been replaced with a transparent conductive layer.

In this embodiment, a multi-layered mirror as shown in FIG. 12 was formed through RF magnetron sputtering by: first alternately depositing a layer of $SiO_2$ as a low-refractive-index compound in a thickness of 96.5 nm and a layer of $TiO_2$ as a high-refractive-index compound in a thickness of 58.3 nm, three times in this order; then depositing $SiO_2$; and finally depositing ITO as a transparent conductive compound in a thickness of 73.7 nm. This multi-layered mirror exhibited similar performance to the cases where only $SiO_2$ or $TiO_2$ were used, and achieved a reflectance of 90% or higher. On this multi-layered mirror, a triphenylamine tetramer 50 nm in thickness was formed and a 60-nm-thick luminous layer doped with 1 percent of quinacridone was then deposited by simultaneous vapor deposition of alumiquinolinol complex and quinacridone. Subsequently, an MgAg electrode (metal mirror) 180 nm in thickness was formed. The structural formulas of triphenylamine tetramer and quinacridone are shown in the following.

to the fourth embodiment. As is clear from FIG. 15, efficient forward directivity could be achieved. In this case, the light intensity on the front side was 5000 $cd/m^2$ at maximum. The light intensity can be increased because, as mentioned above, the thickness of the transparent conductive layer can be increased and the electrical resistance can be decreased, hence the heat generation by current can be suppressed to a low level, allowing a large current to be conducted.

As has been described, according to the present invention, it is possible to provide a micro-optical resonator type organic electroluminescent device with superior monochromaticity, emission efficiency, and forward directivity without the use of lenses or filters.

What is claimed is:

1. A micro-optical resonator organic electroluminescent device comprising:

a multi-layered mirror having two alternately laminated layers with different refractive indexes;

a transparent conductive layer as an anode formed on said multi-layered mirror;

an organic compound layer of a single layer or a plurality of layers formed on said transparent conductive layer; and a metal mirror, as a cathode, capable of reflecting light, said multi-layered mirror and said metal mirror forming a micro-optical resonator for enhancing light output from said organic compound layer,

TRIPHENYLAMINE TETRAMER

QUINACRIDONE

Figure 14:
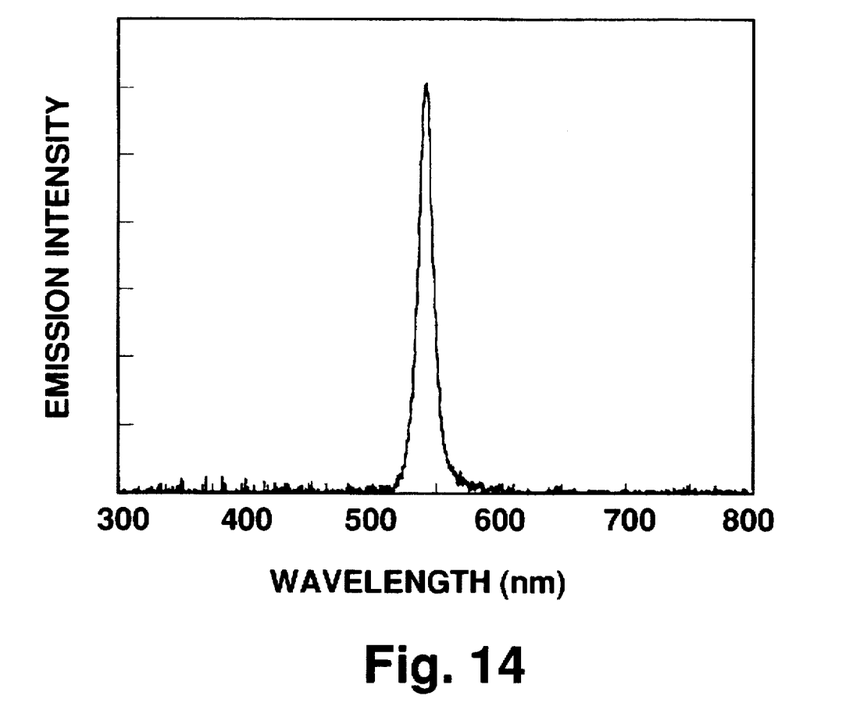
FIG. 14 is a diagram showing the emission spectrum of the fourth embodiment.
Figure 15:
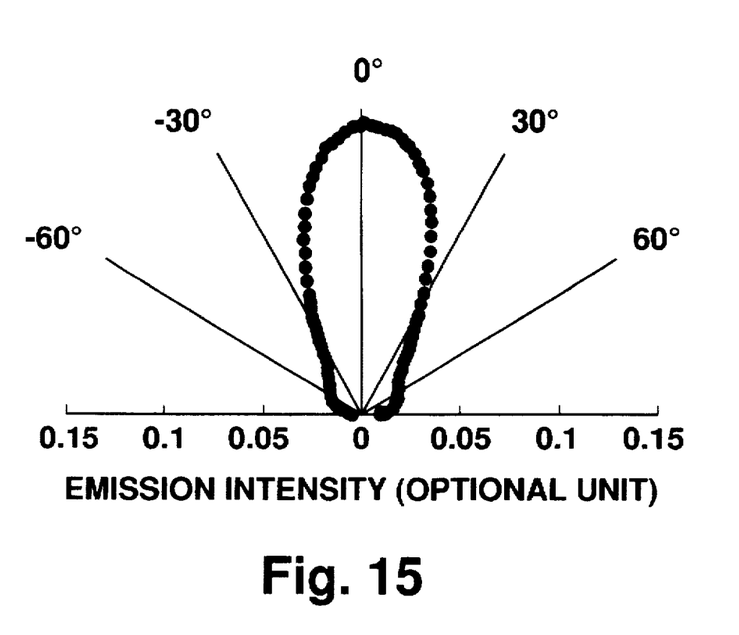
FIG. 15 is a diagram showing the radiation pattern of the fourth embodiment.

When a voltage of 6V was applied to the device according to the fourth embodiment, the device emitted a vivid green light. The emission peak was 530 nm as shown in FIG. 14. In FIG. 14, the abscissa represents wavelength and the ordinate represents emission intensity. FIG. 15 shows the radiation pattern of light emitted from the device according wherein an optical length L of the micro-optical resonator is such that radiation from the micro-optical resonator has a single mode spectrum free of low mode components, said optical length L of said micro-optical resonator is given by the equation set forth below which takes into account the penetration depth of light into the inside of said multi-layered mirror, $$L = \frac{\lambda}{2}\left(\frac{neff}{\Delta n}\right) + \Sigma nidi\cos\theta$$

where λ is the wavelength of a resonating light, neff is the effective refractive index of the multi-layered mirror, Δn is in the difference of the refractive indexes of the two layers in the multi-layered mirror, ni and di are the refractive index and the total thickness of the organic compound and the transparent conductive layer, and θ is the angle of the light incident on an interface between organic compound layers or between an organic compound layer and a transparent conductive layer, with respect to the normal to the interface, wherein the optical length L is 1.5 times a required emission wavelength.

2. A micro-optical resonator organic electroluminescent device according to claim 1, wherein the total thickness of said transparent conductive layer and said organic compound layer is 150 nm or less.

3. A micro-optical resonator organic electroluminescent device according to claim 1, wherein an uppermost layer of said multi-layered mirror is formed of said transparent conductive layer, and said uppermost transparent conductive layer works as a part of said multi-layered mirror and also serves as said transparent conductive layer.

4. A micro-optical resonator organic electroluminescent device according to claim 1, wherein a required emission wavelength is less than a peak wavelength λm of an emission spectrum of an electroluminescent material to be used.

5. A micro-optical resonator organic electroluminescent device according to claim 4, wherein the required emission wavelength is in a range from (λm−10) nm to (λm−50) nm.

6. A micro-optical resonator organic electroluminescent device according to claim 1, wherein said organic compound layer is any of a single-layer structure of a luminous layer, a two-layer structure of a hole transport layer and a luminous layer, or a luminous layer and an electron transport layer, or a three-layer structure of a hole transport layer, a luminous layer and an electron transport layer.

7. A micro-optical resonator organic electroluminescent device according to claim 1, wherein the optical length of each layer of said multi-layered mirror is ¼ of the central wavelength of a stop band.

8. A micro-optical resonator organic electroluminescent device according to claim 1, wherein said multi-layered mirror is formed by alternately laminating two layers with different refractive indexes, said layers being formed of oxides, nitrides, or semiconductors, or a combination of these materials.

9. A micro-optical resonator organic electroluminescent device according to claim 8, wherein said multi-layered mirror is formed by any of the combinations of $TiO_2$ and $SiO_2$, $SiN_x$ and $SiO_2$, $Ta_2O_5$ and $SiO_2$, or GaAs and GaInAs.

10. A micro-optical resonator organic electroluminescent device according to claim 1, wherein said transparent conductive layer is formed of Pt, Au, Ni, Cu, Ag, Ru, Cr, ITO, $SnO_2$, $In_2O_3$ or ZnO, or any composite of these materials.

11. A micro-optical resonator organic electroluminescent service according to claim 1, wherein said metal mirror is formed of Al, Mg, Ca, Li, Na, Ag, or Y, or an alloy of those metals.

12. A micro-optical resonator organic electroluminescent device comprising:

a multi-layered mirror having two alternately laminated layers with different refractive indexes;

a transparent conductive layer as an anode formed on said multi-layered mirror;

an organic compound layer of a single layer or a plurality of layers formed on said transparent conductive layer; and a metal mirror, as a cathode, capable of reflecting light, said multi-layered mirror and said metal mirror forming a micro-optical resonator for enhancing light output from said organic compound layer, wherein an optical length L of the micro-optical resonator is such that radiation from the micro-optical resonator has a single mode spectrum free of low mode components, said optical length L of said micro-optical resonator is given by the equation set forth below which takes into account the penetration depth of light into the inside of said multi-layered mirror, $$L = \frac{\lambda}{2}\left(\frac{neff}{\Delta n}\right) + \Sigma nidi\cos\theta$$

where λ is the wavelength of a resonating light, neff is the effective refractive index of the multi-layered mirror, Δn is in the difference of the refractive indexes of the two layers in the multi-layered mirror, ni and di are the refractive index and the total thickness of the organic compound and the transparent conductive layer, and θ is the angle of the light incident on an interface between organic compound layers or between an organic compound layer and a transparent conductive layer, with respect to the normal to the interface, wherein the optical length L is 1.5 times a required emission wavelength, and wherein the required emission wavelength is in a range from (λm−10) nm to (λm−50) nm.

* * * * *